United States Patent [19]

Wong

[11] Patent Number: 5,170,372
[45] Date of Patent: Dec. 8, 1992

[54] MEMORY DEVICE HAVING BIT LINES OVER A FIELD OXIDE

[75] Inventor: Man Wong, Dallas, Tex.

[73] Assignee: Texas Instruments Incorporated, Dallas, Tex.

[21] Appl. No.: 870,158

[22] Filed: Apr. 15, 1992

Related U.S. Application Data

[63] Continuation of Ser. No. 568,390, Aug. 16, 1990, abandoned.

[51] Int. Cl.[5] ............................................. G11C 11/40
[52] U.S. Cl. .................................. 257/304; 257/305; 365/149
[58] Field of Search ........................... 365/63, 149; 357/23.6 R, 23.6 G; 437/52

[56] References Cited

U.S. PATENT DOCUMENTS

| | | | |
|---|---|---|---|
| 4,673,962 | 6/1987 | Chatterjee et al. | 365/149 |
| 4,752,819 | 6/1988 | Koyama | 365/149 |
| 4,792,834 | 12/1988 | Uchida | 365/149 |
| 4,794,563 | 12/1988 | Maeda | 365/149 |
| 4,914,628 | 4/1990 | Nishimura | 365/149 |

Primary Examiner—Joseph L. Dixon
Assistant Examiner—Jack A. Lane
Attorney, Agent, or Firm—Stanton C. Braden; Richard L. Donaldson; William E. Hiller

[57] ABSTRACT

A memory device having an array of memory cells each including a trench capacitor and a pass transistor. The transistor has its source connected to the storage capacitor, its drain connected to a bit line, and its gate connected to a word line. The bit line is formed over a field oxide layer formed on the semiconductor substrate so there is minimal contact between the bit line and the semiconductor substrate. The storage dielectric in the trench is recessed from the surface of the semiconductor substrate.

9 Claims, 1 Drawing Sheet

MEMORY DEVICE HAVING BIT LINES OVER A FIELD OXIDE

This application is a continuation of application Ser. No. 07/568,390, filed Aug. 16, 1990, now abandoned.

BACKGROUND OF THE INVENTION

The present invention relates generally to integrated circuit memory devices, and specifically to methods and apparatus for reducing bit line capacitance and soft error rates in such memory devices.

Large dynamic random access memories (DRAMS) generally comprise an array of memory cells on, or in, a silicon substrate. Each cell typically includes a single metal-oxide semiconductor field effect transistor (MOSFET) with its source connected to a storage capacitor, its drain connected to a bit line, and its gate connected to a word line. The cell operates by storing a charge on the capacitor for a logic "1" and not storing any charge for a logic "0". Traditionally, the cell capacitor has been formed by an inversion layer separated from an overlying electrode by a thin oxide layer and from the substrate by a depletion layer. Alternatively, the cell capacitor can be formed in a trench etched into the substrate. This type of capacitor has the capacitor plates formed on the walls of the trench.

Regardless of the capacitor type used, one concern with such memory cells is the susceptibility of such cells to soft errors caused by a stray electrical charges from surrounding circuitry, or radiation such as alpha particles, striking either the capacitor or the bit line thereby resulting in a change in the charge in the cell being affected.

Another concern with DRAMs is the capacitance of the bit lines. As the capacitance increases, the speed of the memory becomes slower. There is a need therefore to provide reduced bit line capacitance while minimizing the susceptibility of the device to soft errors caused by stray electrical charges.

SUMMARY OF THE INVENTION

Accordingly, it is one object of the present invention to provide a memory cell having reduced susceptibility to soft errors caused by stray electrical charges.

It is another object of the present invention to provide a memory device having reduced bit line capacitance.

It is another object of the present invention to provide a memory device in which trench capacitors minimizing the susceptibility of trench-to-trench leakage can be utilized.

It is another object of the present invention to provide a memory device utilizing trench capacitors in which the storage dielectric is recessed from the exposed surface of the trench to reduce the susceptibility of the trench to damage due to implanting and/or processing steps used in the manufacture of the devices.

The foregoing objects are accomplished in a memory device having an array of memory cells each including a trench capacitor and a pass transistor. The transistor has its source connected to the storage capacitor, its drain connected to a bit line, and its gate connected to a word line. The bit line is formed over a field oxide layer formed on the semiconductor substrate so there is minimal contact between the bit line and the semiconductor substrate. The storage dielectric in the trench is recessed from the surface of the semiconductor substrate.

BRIEF DESCRIPTION OF THE DRAWINGS

The present invention will be described with reference to the accompanying drawings, wherein.

DESCRIPTION OF THE PREFERRED EMBODIMENT

Figure 1A:
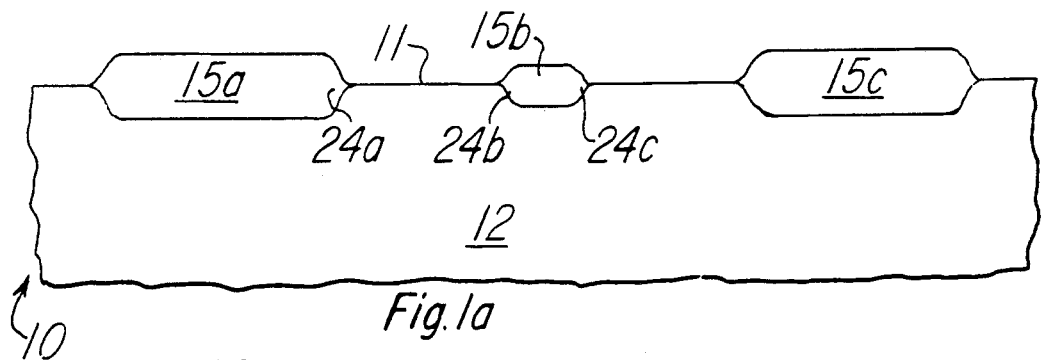
FIGS. 1 a–d are enlarged partial cross sectional view of a device manufactured according to the present invention with FIG. 1d being a partial cross sectional view of the preferred embodiment of the present invention.

The device 10 of the present invention is manufactured in the following manner having reference to FIGS. 1 a–d. FIG. 1a is a cross sectional view of a semiconductor substrate 12 after LOCOS (Local Oxidation of Silicon) formation in which a field oxide layer is selectively grown on the surface of the substrate to form regions 15a, 15b and 15c. Alternatively, the entire surface of the semiconductor substrate can receive a field oxide layer, and the areas between oxide regions etched to expose the substrate surface 11. As is clearly shown in FIG. 1a, the etched or selectively grown oxide layer will inherently have edges, such as edges 24a, 24b and 24c, where the substrate surface 11 is exposed. It is unnecessary or undesirable to have peripheral circuits (not shown) constructed with raised transistors as will be done within the memory array, the peripheral LOCOS can be partially formed, the memory cell array patterned, and then the memory cell array LOCOS formed while completing the peripheral LOCOS.

Figure 1B:
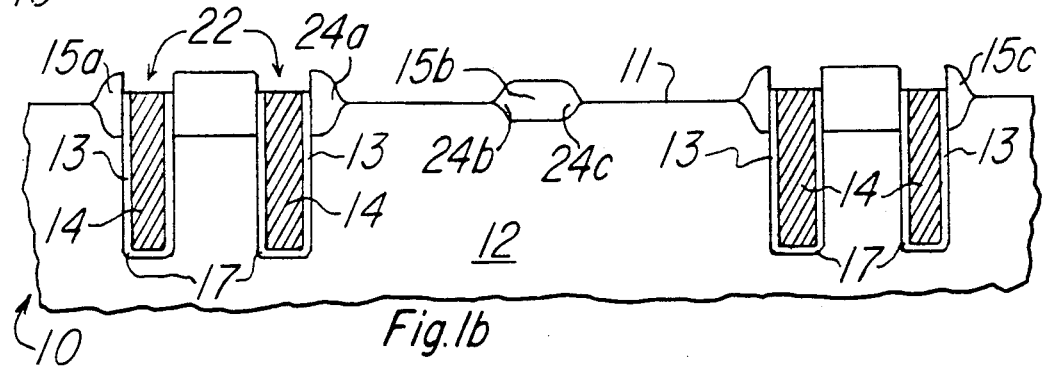

The next step, resulting in the structural configuration shown in FIG. 1b, is to form the capacitor trenches 13 in selected areas of the field oxide layers, such as regions 15a and 15c in the memory cell array, such as by deep etching process, and filling the trenches 13 so formed with a storage dielectric material 17 and capacitor plate material 14 such as ISD-As poly. The capacitor plate material 14 also preferably is etched back from the surface of the field oxide layer 15a to form a recess 22 within the trench 13.

Figure 1C:
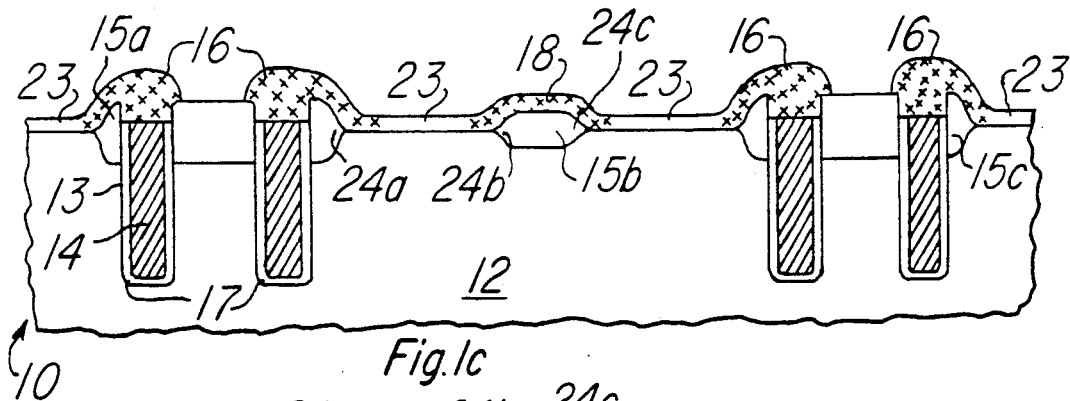

An epitaxial layer 23 is then deposited on the semiconductor substrate 12 between field oxide regions 15a and 15c to define word line paths. Polycrystalline silicon layer 16 is also deposited simultaneously over the field oxide layer 15a and extended into the recesses 22 formed in the trenches 13. The resultant configuration is shown in FIG. 1c.

Word lines 21 operate with polysilicon layer 23 to form the gates of the pass transistors in a conventional manner. Finally, the pass gate transistors are patterned on the epitaxial layer 23 and the source/drain regions 19, 20 of the transistors implanted in the substrate 12 at desired locations as shown in FIG. 1d.

Figure 1D:
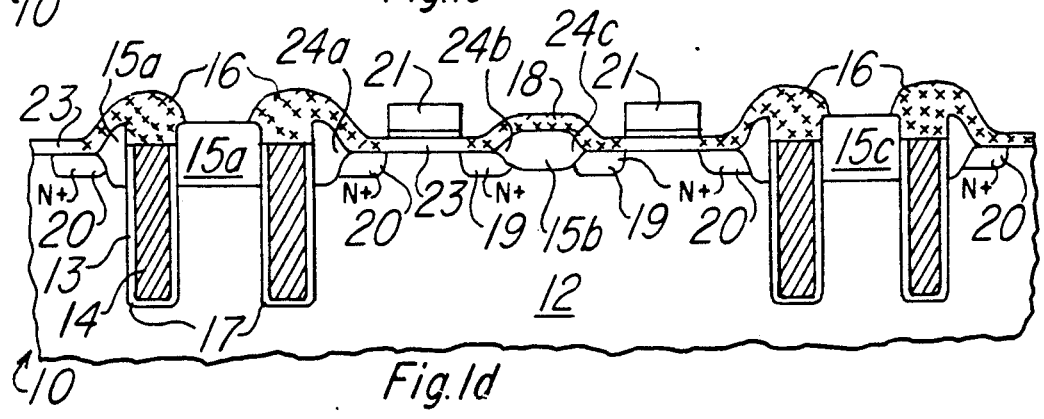

Referring now to FIG. 1d there is shown a preferred embodiment of the present invention. The memory device 10 of the present invention includes a semiconductor substrate 12, such as the p-type substrate shown. The memory device 10 has a plurality of trench capacitors 13 formed in the substrate 12 by any convenient means such as a deep etching process previously discussed. The interior of each trench 13 is filled with a suitable storage dielectric material 17 and capacitor plate material 14 to form a trench capacitor. Polycrystalline silicon is deposited over the open areas of the trenches to provide a conductive contact 16 operable contacting the capacitor plate material 14 in the trenches 13. The bit line contact 18 is formed over the field oxide layer 15a, and as is clearly shown in FIG. 1d extends sufficiently beyond the edges 24b and 24c of region 15b to provide contact with highly doped regions 19 of a conductivity type opposite that of the substrate 12. The highly doped region 19 forms the source of the pass transistor associated with word line 21. Highly doped region 20 forms the drain of the pass transistor. This drain region 20 is also in contact with conductive contact 16.

In operation, a charge present on bit line 18 can be transferred to the storage dielectric material 14 in trench 13 via the path through source region 19, p-type substrate 12, drain region 20 and conductive contact 16 upon activation of the word line 21. The information present on bit line 18 thus can be read into the trench capacitor of the memory cell. Conversely, information stored in the trench capacitors can be transferred to the bit line via the opposite path.

The resultant semiconductor configuration has the advantages of having the capacitor charge stored in the trench as opposed to on the outer surface of the trench thereby reducing the possibility of trench-to-trench leakage. The storage dielectric, having been recessed from the surface of the field oxide layer, reduces the susceptibility of damage to the storage dielectric material during subsequent implantation or other processing. Since the bit line contact is formed on the field oxide layer, the capacitive coupling between the bit line contact and the semiconductor substrate is minimized. Also, soft error immunity is enhanced de to the storage of capacitor charge in the trench and minimal exposure of the junction between the bit line and the semiconductor substrate. There are fewer exposed locations for stray charges such as alpha particles to impact the charge sensitive components of the device.

Although the present invention has been described with reference to the disclosed embodiments, it is to be understood that this description is by way of example only, and is not to be construed in a limiting sense. It is also to be understood that numerous changes in the details of the embodiments of the invention, and additional embodiments of the invention, may be apparent to and may be made by persons of ordinary skill in the art having reference to this description. For example, p-channel transistors may be substituted for n-channel transistors with the accompanying changes in device design. Also, stacked capacitors can be substituted for trench capacitors. It is contemplated that all such changes and additional embodiments are within the spirit and true scope of the invention as claimed below.

What is claimed is:

1. A memory cell in a semiconductor substrate comprising:
   a field oxide layer on the surface of said substrate, said field oxide layer patterned to selectively expose a surface of said semiconductor substrate and including a region defined by edges;
   a capacitor having a capacitor plate material therein for storage of electrical charge within said capacitor;
   a pass gate transistor having a source and a drain, the drain of said transistor operably connected to said capacitor so as to transfer signals between said capacitor and a bit line; and
   said bit line covering said region of said field oxide layer, said bit line extending sufficiently beyond said edges of said region such that said bit line contacts the surface of said substrate only at said edges, said bit line being connected to the source region of said pass gate transistor, and whereby said bit line has substantially no other contact with said substrate.

2. The memory cell as defined in claim 1, wherein said capacitor plate material is recessed from the surface of said substrate.

3. The memory cell as defined in claim 1, further comprising a conductive layer connecting said capacitor plate and the drain of said pass gate transistor.

4. The memory cell as defined in claim 3, wherein said capacitor plate material is recessed from the surface of said substrate.

5. The memory cell as defined in claim 1, wherein said capacitor is a trench capacitor.

6. A memory device comprising:
   a semiconductor substrate;
   a field oxide layer on the surface of said semiconductor substrate, said field oxide layer patterned to selectively expose the surface of said semiconductor substrate and including a plurality of regions defined by edges;
   a plurality of trench capacitors formed in said substrate, each of said trenches having a capacitor plate material therein for storing charge within said trench;
   a plurality of pass gate transistors each having a source and drain, the drain of said transistors operably connected to an associated one of said trench capacitors so as to transfer signals between a selected one of said trench capacitors and an associated bit line,
   a bit line covering said plurality of regions of said field oxide layer, said bit line having a size selected to extend sufficiently beyond said edges of said regions such that said bit line contacts the surface of said substrate only at said edges, said bit line being connected to the source region of its associated one of said pass gate transistors, and whereby said bit line has substantially no other contact with said substrate.

7. The memory device as defined in claim 6, wherein said capacitor plate material is recessed from the surface of said substrate.

8. The memory cell as defined in claim 6, further comprising a conductive layer connecting said capacitor plate material and the drain of its associated one of said pass gate transistors.

9. The memory cell as defined in claim 8, wherein said capacitor plate material is recessed from the surface of said substrate.

* * * * *